United States Patent

Chang et al.

[11] Patent Number: 6,119,262
[45] Date of Patent: Sep. 12, 2000

[54] METHOD AND APPARATUS FOR SOLVING KEY EQUATION POLYNOMIALS IN DECODING ERROR CORRECTION CODES

[75] Inventors: Hsie-Chia Chang, Keelung; Chuen-Shen Bernard Shung, 122, Shy Wei Road, Taipei, both of Taiwan

[73] Assignee: Chuen-Shen Bernard Shung, Taipei, Taiwan

[21] Appl. No.: 08/914,427

[22] Filed: Aug. 19, 1997

[51] Int. Cl.[7] .................................................. H03M 13/00
[52] U.S. Cl. ............................ 714/781; 714/779; 341/94
[58] Field of Search .................... 714/781, 782, 714/784, 785, 779; 341/94

[56] References Cited

U.S. PATENT DOCUMENTS

| | | | |
|---|---|---|---|
| 4,162,480 | 7/1979 | Berlekamp | 340/146.1 |
| 5,483,236 | 1/1996 | Bi | 341/94 |
| 5,583,499 | 12/1996 | Oh et al. | 341/94 |
| 5,805,616 | 9/1998 | Oh | 714/785 |

OTHER PUBLICATIONS

E. R. Berlekamp, "Binary BCH Codes for Correcting Multiple Errors" Algebraic Coding Theory, McGraw–Hill, New York, 1968, pp. 176–199.

I.S. Reed et al., "VLSI design of inverse–free Berlekamp–Massey algorithm" IEE Proceedings–E, vol. 138, No. 5, Sep. 1991, pp. 295–298.

Herbert O. Burton, "Inversionless Decoding of Binary BCH Codes", IEE Transactions on Information Theory, vol. IT–17, No. 4, Jul. 1971, pp. 464–466.

Kuang Yung Liu, "Architecture for VLSI Design of Reed–Solomon Decoders", IEE Transactions on Computers, vol. C–33, No. 2, Feb. 1984, pp. 178–189.

James L. Massey, "Shift–Register Synthesis and BCH Decoding", IEEE Transactions on Information Theory, vol. IT–15, No. 1, Jan. 1969, pp. 122–127.

*Primary Examiner*—Albert De Cady
*Assistant Examiner*—Jason Greene
*Attorney, Agent, or Firm*—Claude A. S. Hamrick; Oppenheimer Wolff Donnelly; Emil Chang

[57] ABSTRACT

In decoding an received codeword encoded for error correction purposes, a method for computing error locator polynomial and error evaluator polynomial in the key equation solving step is presented whereby the polynomials are generated through a number of intermediate steps that can be implemented with minimal amount of hardware circuitry. The number of intermediate steps requires a corresponding number of cycles to complete the calculation of the polynomials. Depending on the selected (N, K) code, the number of cycles required for the calculation of the polynomials would be within the time required for the calculation of up-stream data. More specifically, an efficient scheduling of a small number of finite-field multipliers (FFM's) without the need of finite-field inverters (FFI's) is disclosed. Using these new methods, an area-efficient architecture that uses only three FFM's and no FFI's is presented to implement a method derived from the inversionless Berlekamp-Massey algorithm. This method and architecture can be applied to a wide variety of RS and BCH codes with suitable code sizes.

10 Claims, 3 Drawing Sheets

METHOD AND APPARATUS FOR SOLVING KEY EQUATION POLYNOMIALS IN DECODING ERROR CORRECTION CODES

BACKGROUND OF THE INVENTION

1. Field of the Invention

The present invention generally relates to methods and apparatus for decoding error correcting codes, and, more particularly, relates to methods and apparatus for determining error locator polynomials and error evaluator polynomials in the process of decoding error correcting codes.

2. Description of the Prior Art

In the transmission of data from a source location to a destination location through a variety of media, noise caused by the transmission path and/or the media itself causes errors in the transmitted data. Thus, the data transmitted is not the same as the data received. In order to determine the errors in the received data, various methods and techniques have been developed to detect and correct the errors in the received data. One of the methods is to generate a codeword which includes a message part (data to be transmitted) and a parity part (information for performing error correction).

In this context and in one form, codewords are generated from encoding operations performed upon the original data comprising of symbols to yield an encoded word (codeword) of information having N symbols where the first K symbols are message symbols and the subsequent N–K symbols are parity symbols. The encoded redundancy in the form of N–K parity symbols is then available during the decoding operation to detect and correct errors in the codeword (for all N symbols) up to some limit or merely to detect errors up to some larger limit.

Among the most well-known error-correcting codes, the BCH (Bose-Chaudhuri-Hocquenghen) codes and the Reed-Solomon (RS) codes are the most widely used block codes in the communication field and storage systems. The mathematical basis of BCH and RS codes is explained by: E. R. Berlekamp, *Algebraic Coding Theory*, McGraw-Hill, New York, 1968; and S. Lin and D. J. Costello, *Error Control Coding: Fundamentals and Applications*, Prentice-Hall, Englewood Cliffs, N.J., 1983.

An (N, K) BCH or RS code has K message symbols and N coded symbols, where each symbol belongs to GF(q) for a BCH code or $GF(q^m)$ for a RS code. A binary (N,K) BCH code can correct up to t errors with $N=2^m-1$, $N-K \leq mt$. An (N, K) RS code can correct t errors and ρ erasures with $2t+\rho \leq N-K$. For binary BCH codes, an error can be corrected simply by finding out the error location. For RS codes, an error can be corrected by finding out the error location and the error value. In RS codes, an erasure is defined to be an error with a known error location, and hence its correction reduces to finding the error value.

The method steps for common popular RS decoder architectures for the correction of errors can be summarized into four steps: (1) calculating the syndromes from the received codewords, (2) computing the error locator polynomial and the error evaluator polynomial, (3) finding the error locations, and (4) computing the error values. If both errors and erasures and corrected (defined as errata), the four steps are modified to: (1) calculating the syndromes and Forney syndromes from the received codewords and the erasure locations, (2) computing the errata locator polynomial and the errata evaluator polynomial, (3) finding the errata locations, and (4) computing the errata values.

Referring to FIG. 1a, the general decoding steps are illustrated. The received data, R(x), is provided to a syndrome generator 10 to generate a syndrome polynomial, S(x), representing the error pattern of the codeword from which the errors can be corrected. The syndromes depend only on the error pattern (which is part of the syndrome) and not on the transmitted codeword. The syndromes are then provided to a key equation solver 12 using a well-known Berlekamp-Massey algorithm to generate an error locator polynomial, σ(x), and an error evaluator polynomial, Ω(x). The error locator polynomial indicates the location(s) of the error and the error evaluator polynomial indicates the value (s) of the error. In the next step, the error locator polynomial is passed to a Chien search engine 14 to generate the root(s), $\beta_I^{-1}$, indicating the location(s) of the errors. The error value evaluator 16, receiving the root(s) and the error evaluator polynomial, Ω(x), generates the error value(s) corresponding to the root(s).

In the implementation of the key equation solver (step 2 above), the step involves solving the key equation which is $$S(x)\sigma(x) = \Omega(x) \bmod x^{N-K}$$

where S(x) is the syndrome polynomial, σ(x) is the error locator polynomial and Ω(x) is the error evaluator polynomial. When both errors and erasures are corrected, σ(x) and Ω(x) are the errata locator polynomial and the errata evaluator polynomial, respectively. When both errors and erasures are corrected, $\sigma(x)=\lambda(x)\Lambda(x)$, where λ(x) and Λ(x) each corresponds to the error locator polynomial and the erasure locator polynomial, respectively. FIG. 1b illustrates the general processing steps for the errata correction. The syndrome calculator 20 receives not only R(x) but also erasure data and generates the syndrome polynomial S(x) and the Forney syndrome polynomial T(x). The key equation solver 22 processes S(x) and T(x) to generate the errata evaluator polynomial, Ω(x), and the errata locator polynomial, σ(x). The errata locator polynomial is provided to a Chien search engine 24 to determine the locations of the errors, while both the errata evaluator polynomial and errata locations are provided to an errata value evaluator to generate the errata values.

The techniques frequently used to solve the key equation include the Berlekamp-Massey algorithm, the Euclidean algorithm, and the continuous-fraction algorithm. Compared to the other two algorithms, the Berlekamp-Massey algorithm is generally considered to be the one with the smallest hardware complexity. The detailed description of the Berlekamp-Massey algorithm is explained in Chapter 7 of the Berlekamp reference cited above and the article by J. L. Massey, Shift-Register Synthesis and BCH Decoding, IEEE Transaction on Information Theory, IT-15:122–127, 1969. An inversionless Berlekamp-Massey algorithm was proposed by Burton to eliminate the costly finite-field inverters (FFIs). H. O. Burton, Inversionless Decoding of Binary BCH Codes, IEEE Transaction on Information Theory, IT-17:464–466, 1971.

Prior art technologies applied the traditional Berlekamp-Massy algorithm (or variation thereof) for the calculation of the error locator polynomial and the error evaluator polynomial, and designed circuits based upon these algorithms. However, each of these algorithms require a large number of finite-field multipliers (FFM) and perhaps a finite-field inverters (FFI). Each of the FFM's and FFI's translates into a hardware circuitry and real estate on an integrated circuit chip. Therefore, the goal here is to derive a method for solving of the polynomials in an efficient manner and to minimize the amount of circuitry required in the implementation of the algorithm. The number of FFM's and FFI's is typically a function of the variable t, which is a function of (N–k)/2. Table 1 illustrates the authors of the algorithms and the corresponding number of FFM's and FFI's for t equals 8:

TABLE 1

| Reference | FFM's as a function of t | FFM's | FFI's |
|---|---|---|---|
| Berlekamp | 3t | 24 | 1 |
| Liu | 2t – 1 | 17 | 1 |
| Oh | 2t | 16 | 1 |
| Reed | 3(t + 1) | 27 | 0 |

As is listed in Table 1 in reference to error correction only (not errata), one implementation of the traditional Berlekamp-Massey algorithm (Berlekamp, U.S. Pat. No. 4,162,480) requires 3t or 24 FFM's and 1 FFI. In the article Architecture for *VLSI Design of Reed-Solomon Decoders,* IEEE Transactions on Computers, Vol. c-33, No. 2, February 1984, Liu demonstrated an algorithm requiring 2t–1 or 17 FFM's and 1 FFI. In U.S. Pat. No. 5,583,499, Oh et al. disclosed a circuitry requiring 2t or 16 FFM's and 1 FFI.

On the other hand, Reed et al. have shown that for algorithms where inversion is not required, the relatively complex FFI circuitry is not required as well. *VLSI Design of Inverse-Free Berlekamp-Massey Algorithm,* Reed, Shih, and Truong, IEE Proceedings-E, Vol. 138, No. 5, September 1991. However, although Reed's algorithm demonstrated the elimination of the FFI, the resulting algorithm required a greater number of FFM's, beyond 3t! For errata correction, the number of FFM's required are even higher, usually 2 times of the case for error correction.

Therefore, it would be desirable to have an inversionless method and apparatus that requires no FFIs and minimizes the number of FFMs in the implementation thereof.

SUMMARY OF THE INVENTION

Accordingly, it is an object of the present invention to provide a method and apparatus for solving key equation polynomials in the decoding of codewords.

It is another object of the present invention to provide a method and apparatus based upon the Berlekamp-Massey algorithm that can be implemented with minimal hardware circuitry.

It is yet another object of the present invention to provide a method and apparatus for solving key equation polynomials without decreasing the overall decoding speed of the decoder.

Briefly, in a presently preferred embodiment, a method for computing error locator polynomial and error evaluator polynomial in the key equation solving step of the error correction code decoding process is presented whereby the polynomials are generated through a number of intermediate steps that can be implemented with minimal amount of hardware circuitry. The number of intermediate steps requires a corresponding number of cycles to complete the calculation of the polynomials. However, depending on the selected (N, K) code, the number of cycles required for the calculation of the polynomials would be within the time required for the calculation of up-stream data.

More specifically, a presently preferred method for computing the error locator polynomial and the error value polynomial employs an efficient scheduling of a small number of finite-field multipliers (FFM's) without the need of finite-field inverters (FFI's) is illustrated. Using these new methods, an area-efficient architecture that uses only three FFM's and no FFI's is presented to implement a method derived from the inversionless Berlekamp-Massey algorithm. This method and architecture can be applied to a wide variety of RS and BCH codes with suitable code sizes.

An advantage of the present invention is that it provides a method and apparatus for solving key equation polynomials in the decoding of codewords.

Another advantage of the present invention is that it provides a method and apparatus based upon the Berlekamp-Massey algorithm that can be implemented with minimal hardware circuitry.

Yet another advantage of the present invention is that it provides a method and apparatus for solving key equation polynomials without decreasing the overall decoding speed of the decoder.

These and other features and advantages of the present invention will become well understood upon examining the figures and reading the following detailed description of the invention.

IN THE DRAWINGS

FIG. 1*a* illustrates the processing blocks in the decoding of codewords with error correction;

FIG. 1*b* illustrates the processing blocks in the decoding of codewords with errata correction; and FIG. 2 shows a three-FFM architecture of the preferred embodiment implementing the key equation solver of the present invention.

DETAILED DESCRIPTION OF THE PREFERRED EMBODIMENTS

Figure 1A:
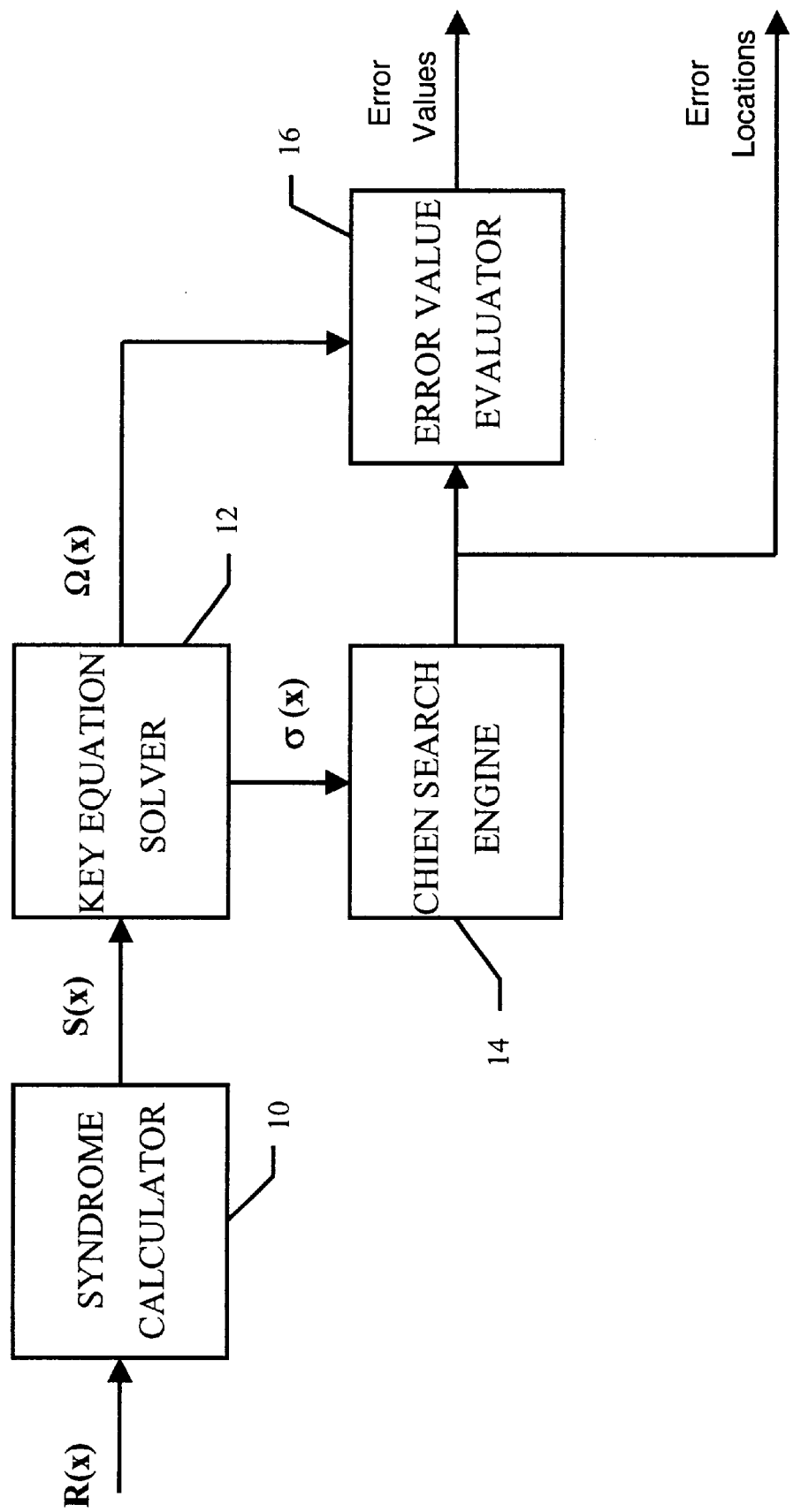
Figure 1B:
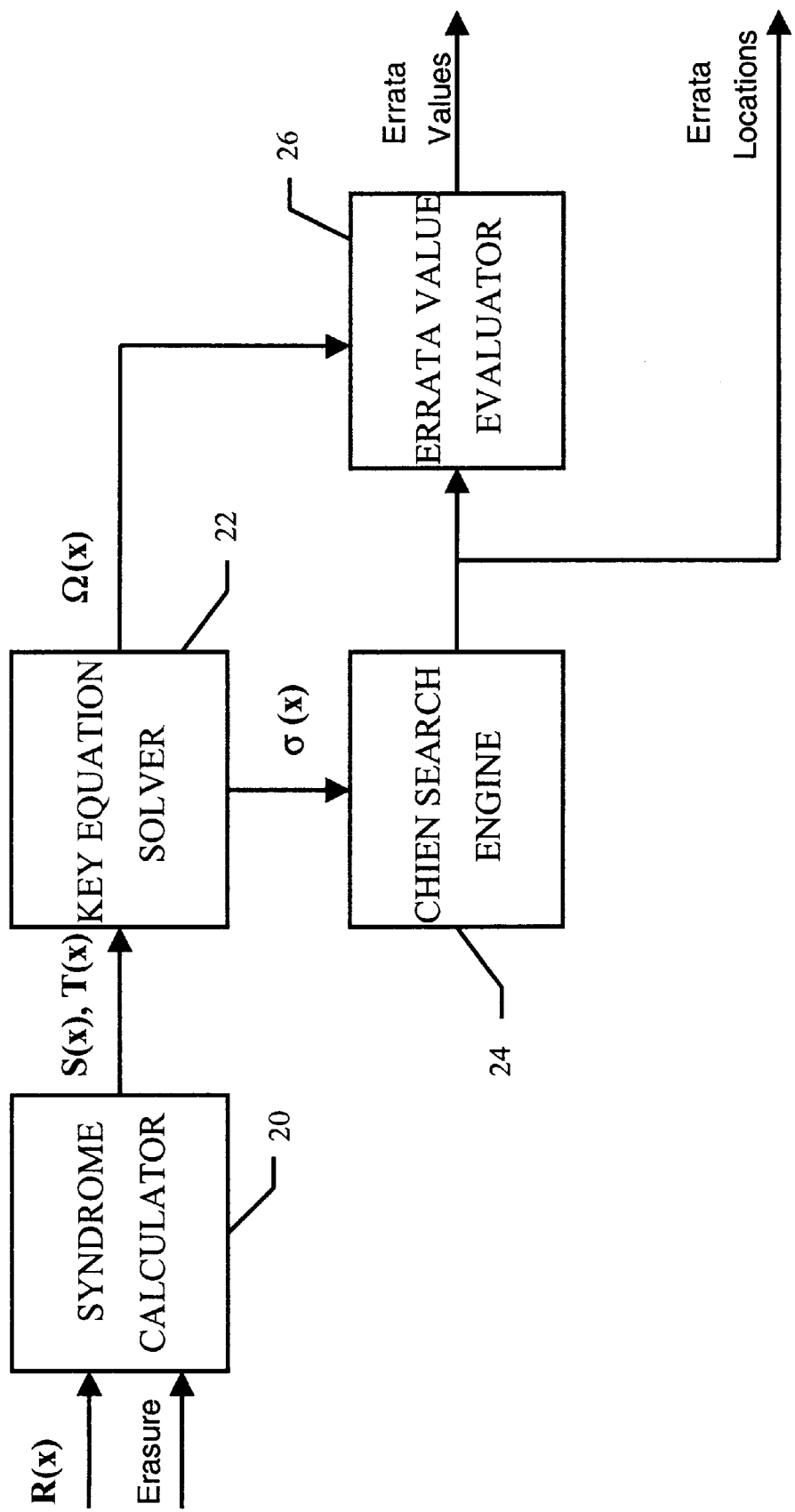

With reference to the notation used herein, symbols without "^" (cap) such as $\Omega$ and $\sigma$ refer to the original Berlekamp-Massey algorithm (with inversion) and the symbols with the "^" (cap) such as a $\hat{\sigma}$, $\hat{\delta}$, $\hat{\Delta}$, $\hat{\tau}$, $\hat{\Omega}$, refers to the inversionless algorithm herein. The inversionless Berlekamp-Massey algorithm of the prior art is a 2t-step iterative algorithm shown below:

Initial condition:

$$D^{(\rho-1)} = 0; \quad \text{(line 1)}$$

$$\hat{\delta} = 1; \quad \text{(line 2)}$$

$$\hat{\sigma}^{(\rho-1)}(x) = \hat{\tau}^{(\rho-1)}(x) = \Lambda(x); \quad \text{(line 3)}$$

$$\hat{\Delta}^{(\rho)} = T_{\rho+1}\hat{\sigma}_0^{(\rho-1)} + T_\rho\hat{\sigma}_1^{(\rho-1)} + \ldots + T_1\hat{\sigma}_\rho^{(\rho-1)} \quad \text{(line 4)}$$

$$= T_{\rho+1}\Lambda_0 + T_\rho\Lambda_1 + \ldots + T_1\Lambda_\rho \quad \text{(line 5)}$$

for $i = \rho$ to $N - K - 1$ (line 6)

$$\hat{\sigma}^{(i)}(x) = \hat{\delta} \cdot \hat{\sigma}^{(i-1)}(x) + \hat{\Delta}^{(i)} x \hat{\tau}^{(i-1)}(x) \quad \text{(line 7)}$$

$$\hat{\Delta}^{(i+1)}(x) = T_{i+2}\hat{\sigma}_0^{(i)} + T_{i+1}\hat{\sigma}_1^{(i)} + \ldots + T_{i-v_i+\rho+2}\hat{\sigma}_{v_i+\rho}^{(i)} \quad \text{(line 8)}$$

If $\hat{\Delta}^{(i)} = 0$ or $2D^{(i-1)} \geq i + 1$ (line 9)

$$D^{(i)} = D^{(i-1)}; \hat{\tau}^{(i)}(x) = x\hat{\tau}^{(i-1)}(x); \quad \text{(line 10)}$$

else (line 11)

$$D^{(i)} = i + 1 - D^{(i-1)}; \hat{\delta} = \hat{\Delta}^{(i)}; \hat{\tau}^{(i)}(x) = \hat{\sigma}^{(i-1)}(x); \quad \text{(line 12)}$$

where $\rho$ is the number of erasures in the range of $0 \leq \rho \leq N-K$;

$$\Lambda(x) = \prod_{\alpha^i \in \Lambda} (1 + \alpha^i x)$$

and $\Lambda$ is the erasure set; $T_j$'s are the coefficients of the Forney syndrome polynomial T(x), where $T(x)=\Lambda(x)S(x)$ mod $x^{N-K}$; $\hat{\sigma}^{(i)}(x)$ is the i-th step errata locator polynomial with degree $v_i+\rho$; $\hat{\sigma}_j^{(i)}$'s are the coefficients of $\hat{\sigma}^{(i)}(x)$; $\hat{\Delta}^{(i)}$ is the i-th step discrepancy and $\hat{\delta}$ is a previously generated discrepancy; $\hat{\tau}^{(i)}(x)$ is an auxiliary polynomial and $D^{(i)}$ is an auxiliary degree variable. Here, the algorithm provides for the correction of errors and erasures. If there are no erasures, $\rho=0$, $T(x)=S(x)$, and $\hat{\sigma}^{-1}(x)=\hat{\tau}^{-1}(x)=1$, and the algorithm is reduced to a simpler form.

It can be shown that the new errata locator polynomial $\hat{\sigma}^{-1}(x)$ obtained by the inversionless Berlekamp-Massey algorithm can be used to find the same error locations as the $\sigma(x)$ found by the original Berlekamp-Massey algorithm.

As is illustrated above, the i-th step inversionless Berlekamp-Massey algorithm contains the following two equations (lines 7 and 8 above):

$$\hat{\sigma}^{(i)}(x) = \hat{\delta} \cdot \hat{\sigma}^{(i-1)}(x) + \hat{\Delta}^{(i)} x \hat{\tau}^{(i-1)}(x) \quad \text{(equ. 1)}$$

$$\hat{\Delta}^{(i+1)} = T_{i+2}\hat{\sigma}_0^{(i)} + T_{i+1}\hat{\sigma}_1^{(i)} + \ldots + T_{i-v_i+\rho+2}\hat{\sigma}_{v_i+\rho}^{(i)} \quad \text{(equ. 2)}$$

As is part of the present invention, the following algorithmic definitions are provided:

$$\hat{\sigma}_i^{(i)} = \hat{\delta} \cdot \hat{\sigma}_0^{(i-1)}, \text{ for } j = 0 \quad \text{(equ. 3a)}$$

$$\hat{\sigma}_j^{(i)} = \hat{\delta} \cdot \hat{\sigma}_j^{(i-1)} + \hat{\Delta}^{(i)} \hat{\tau}_{j-1}^{(i-1)}, \text{ for } 1 \leq j \leq v_i + \rho \quad \text{(equ. 3b)}$$

$$\hat{\Delta}^{(i)} = \hat{\Delta}_{v_{i-1}+\rho}^{(i)} + T_{i-v_{i-1}+\rho+1}\hat{\sigma}_{v_{i-1}+\rho}^{(i-1)}, \text{ for } j = 0 \quad \text{(equ. 4a)}$$

$$\hat{\Delta}_j^{(i+1)} = \hat{\Delta}_{j-1}^{(i+1)} + T_{i-j+3}\hat{\sigma}_{j-1}^{(i)}, \text{ for } j = 1 \leq j \leq v_i + \rho \quad \text{(equ. 4b)}$$

where $\hat{\sigma}_j^{(i)}$'s are the coefficients of $\hat{\sigma}^{(i)}(X)$, and $\hat{\sigma}^{(i)}(X)$ equals $\hat{\sigma}_0^{(i)}+\hat{\sigma}_1^{(i)}x+\ldots+\hat{\sigma}_{v_i+\rho}^{(i)}x^{v_i+\rho}$, $v_i+\rho$ being the degree of $\hat{\sigma}^{(i)}(X)$, and $\hat{\tau}_j^{(i)}$'s are the coefficients of $\hat{\tau}^{(i)}(X)$. $\hat{\Delta}_j^{(i+1)}$'s are the partial results in computing $\hat{\Delta}^{(i+1)}$.

By defining $\hat{\sigma}_j^{(i)}$ for $\hat{\sigma}^{(i)}(x)$ and $\hat{\Delta}_j^{(i+1)}$ for $\hat{\Delta}^{(i+1)}$ as shown above, during each cycle, only two FFMs are required in the calculation of $\hat{\sigma}_j^{(i)}$ and only one FFM is required in the calculation of $\hat{\Delta}_j^{(i+1)}$. In this manner, only three FFMs are required for a given cycle.

By decomposing the original equation (equations 1 and 2) into a series of smaller calculations (equations 3a, 3b, 4a and 4b), the number of FFMs necessary are reduced dramatically. However, there may be data dependency between $\hat{\sigma}_j^{(i)}$ and $\hat{\Delta}_j^{(i+1)}$ in the calculation for each respective value during any one cycle. Table 2 illustrates the data dependency of the decomposed algorithm:

As illustrated in Table 2, during cycle j, the computation of $\hat{\Delta}_j^{(i+1)}$ requires $\hat{\sigma}_{j-1}^{(i)}$ and $\hat{\Delta}_{j-1}^{(i+1)}$, which have been computed in cycle (j−1). Similarly, during cycle j, the computation of $\hat{\sigma}_j^{(i)}$ requires $\hat{\Delta}^{(i)}$ and $\hat{\sigma}_j^{(i-1)}$, which have been computed in cycle 0 and in the (i−1) step, respectively. Appendix A attached herein illustrates the processing steps using the algorithm of the preferred embodiment in generating the errata evaluator polynomial and the errata locator polynomial.

Figure 2:
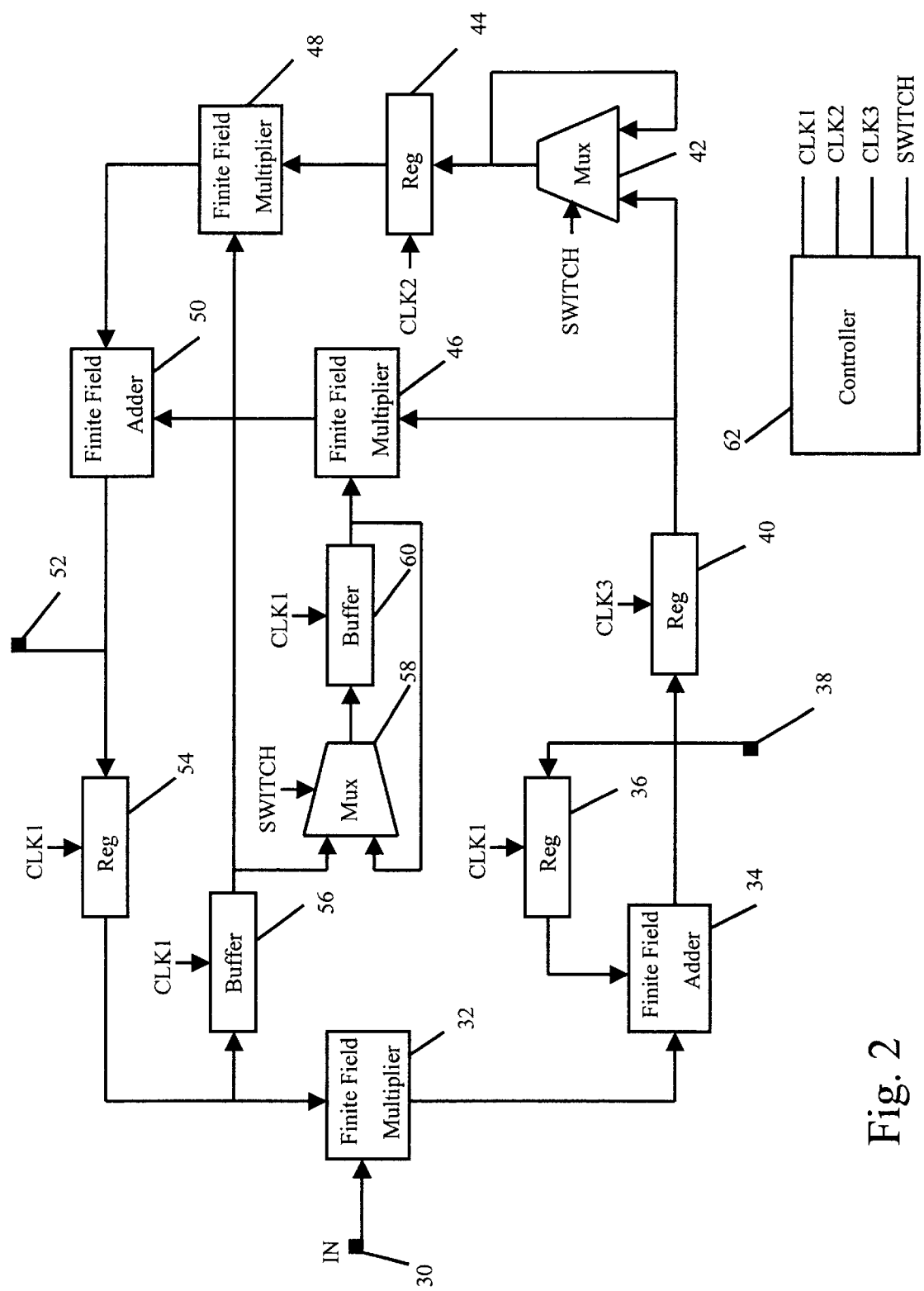

By using the decomposed algorithm shown above, a three-FFM implementation of the inversionless Berlekamp-Massey algorithm as the key equation solver becomes possible and is shown in FIG. 2. A first FFM 32, a first Finite Field Adder 34 (FFA), and register 36 are used to calculate the discrepancy, $\hat{\Delta}_j^{(i)}$. In operation, at the j-th cycle of the i-th step, the FFM 32 receives the Forney syndrome $T_{i-j+3}$ as one input and receives the (j−1)-th coefficient of $\hat{\sigma}^{(i)}(x)$, $\hat{\sigma}_{j-1}^{(i)}$, as a second input. The FFA 34 and register 36 accumulate the multiplication results. With regard to output terminal 38, when the calculation for the errata evaluator polynomial ($\Omega(x)$) coefficients is completed it is provided at this terminal.

FFMs 46 and 48 and FFA 50 compute the coefficients of the errata locator polynomial, $\hat{\sigma}_j^{(i)}$. FFM 46 receives as one input the discrepancy, $\hat{\Delta}^{(i)}$, and another input $\hat{\tau}^{(i-1)}$. Multiplexer 58 and buffer 60 allows the selection and storage of $\hat{\tau}_{j-1}^{(j-1)}$. Buffers 56 and 60 store the coefficient of $\hat{\sigma}(x)$ and $\hat{\tau}(x)$ from the previous step and multiplexer 58 selects the new values of $\hat{\tau}_j^{(i-1)}$. FFM 48 receives as one input $\hat{\sigma}_j^{(i-1)}$ and another input $\hat{\delta}$. Multiplexer 42 and register 44 allow for the selection and storage of $\hat{\delta}$. The output from FFMs 46 and 48 are summed by FFA 50, which generates $\hat{\sigma}_j^{(i-1)}$. $\hat{\sigma}_j^{(i-1)}$ is also stored in register 54 and is fed back to buffer 56 and FFM 32. If $\hat{\Delta}^{(i)}=0$ or $2D^{(i-1)} \leq i+1$, then $\hat{\tau}_j^{(i-1)}=\hat{\tau}_j^{(i-1)}$ and $\hat{\delta}$ remains unchanged; otherwise, $\hat{\tau}_j^{(i)}=\hat{\sigma}_j^{(i-1)}$ and $\hat{\delta}=\hat{\Delta}^{(i)}$. The registers here are used as delay elements which are controlled by various clock signals, clk1, clk2 and clk3, generated by controller 62. Register 44 updates it value at the first cycle of each step. Register 40 updates its value at the second cycle of each step. Register 36 is reset to zero at the second cycle of each step. The output, $\hat{\sigma}_j$ can be obtained at output terminal 52 after 2t steps.

This architecture can be used for error correction as well as errata correction. Compared to previously proposed architectures requiring 4t to 6t FFM's for errata correction or 2t to 3t FFM's for error correction, the preferred embodiment of the present invention significantly reduces hardware complexity down to 3 FFM's. However, in order to finish the i-th step algorithm, the architecture of the preferred embodiment requires $v_i+\rho+1$ cycles whereas prior art architectures requires only two to three cycles.

The additional time required for generating the data under the architecture of the present invention does not slow down the overall system processing speed. One reason here is because the prior art architecture does not synchronize the usage of time and hardware. Although the results at any one stage is quickly calculated, it has to wait for results from up-stream steps in order to have any data to receive and process.

TABLE 2

| cycle | $\hat{\Delta}^{(i+1)}$ | $\hat{\sigma}^{(i)}(x)$ |
|---|---|---|
| j = 0 | $\hat{\Delta}^{(i)} = \hat{\Delta}_{v_{i-1}+\rho}^{(i)} + T_{i-v_{i-1}+\rho+1} \hat{\sigma}_{v_{i-1}+\rho}^{(i-1)}$ | $\hat{\sigma}_0^{(i)} = \hat{\delta} \cdot \hat{\sigma}_0^{(i-1)}$ |
| j = 1 | $\hat{\Delta}_1^{(i+1)} = T_{i+2} \hat{\sigma}_0^{(i)}$ | $\hat{\sigma}_1^{(i)} = \hat{\delta} \cdot \hat{\sigma}_1^{(i-1)} + \hat{\Delta}^{(i)} \hat{\tau}_0^{(i-1)}$ |
| j = 2 | $\hat{\Delta}_2^{(i+1)} = \hat{\Delta}_1^{(i+1)} + T_{i+1} \hat{\sigma}_1^{(i)}$ | $\hat{\sigma}_2^{(i)} = \hat{\delta} \cdot \hat{\sigma}_2^{(i-1)} + \hat{\Delta}^{(i)} \hat{\tau}_1^{(i-1)}$ |
| ... | ... | ... |
| j = $v_i + \rho$ | $\hat{\Delta}_{v_i+\rho}^{(i+1)} = \hat{\Delta}_{v_i+\rho-1}^{(i+1)} + T_{i-v_i+\rho+3} \hat{\sigma}_{v_i+\rho-1}^{(i)}$ | $\hat{\sigma}_{v_i+\rho}^{(i)} = \hat{\delta} \hat{\sigma}_{v_i+\rho}^{(i-1)} + \hat{\Delta}^{(i)} \hat{\tau}_{v_i+\rho-1}^{(i-1)}$ |

Additionally, the method and apparatus of the present invention also minimize hardware by using the same circuitry for the calculation of $\Omega(x)$. The conventional way to compute the errata evaluator polynomial, $\Omega(x)$, is to do it in parallel with the computation of $\sigma(x)$. Using the Berlekamp-Massey algorithm, this process involves a 2t-step iterative algorithm to computer $\Omega^{(i)}(x)$. However, if $\sigma(x)$ with degree $v+\rho$ is first obtained, the key equation and Newton's identity provide:

$$\Omega(x) = S(x)\sigma(x) \bmod x^{N-K}$$
$$= (S_1 + S_2 x + \ldots + S_{N-K} x^{N-K-1}) \cdot (\sigma_0 + \sigma_1 x + \ldots + \sigma_{v+\rho} x^{v+\rho})$$
$$\equiv \Omega_0 + \Omega_1 x + \ldots + \Omega_{v+\rho-1} x^{v+\rho-1}$$
$$\Omega_i = S_{i+1}\sigma_0 + \ldots + S_1 \sigma_i, \; i = 0, 1, \ldots, v+\rho-1.$$

That is the computation of $\Omega(x)$ can be performed directly and more efficiently after $\sigma(x)$ is computed. As demonstrated Reed et al., by using the inversionless Berlekamp-Massey algorithm, $\sigma(x) = C\hat{\sigma}(x)$; thus, by using direct computation, the following results are obtained:

$$\hat{\Omega}(x) = S(x)\hat{\sigma}(x) \bmod x^{N-K}$$
$$= C\Omega(x).$$

By using the Forney's algorithm, it can be shown that $\hat{\sigma}(x)$ and $\hat{\Omega}(x)$ will produce the same errata values:

$$\hat{e}_l = \frac{\hat{\Omega}(\beta_l^{-1})}{\hat{\sigma}^1(\beta_l^{-1})} = \frac{C\Omega(\beta_l^{-1})}{C\sigma'(\beta_l^{-1})} = e_l.$$

Furthermore, it can be seen that the computation of $\hat{\Omega}_i$ is similar to the computation of $\hat{\Delta}^{(i)}$. Thus, the same hardware used to compute $\hat{\sigma}(x)$ can be reconfigured to compute $\hat{\Omega}(x)$ after $\hat{\sigma}(x)$ is computed. Like $\hat{\Delta}^{(i)}$, $\hat{\Omega}_i$ can be computed as follows:

$$\hat{\Omega}_i^{(j)} = S_{i+1}\hat{\sigma}_0, \text{ for } j = 0$$
$$\hat{\Omega}_i^{(j)} = \hat{\Omega}_i^{(j-1)} + S_{i-j+1}\hat{\sigma}_j, \text{ for } j = 1 \le j \le i$$

Specifically, referring back to FIG. 2, FFM 32, FFA 34, and register (delay) 36 are used to compute $\hat{\Omega}_i^{(j)}$. At the j-th cycle for the i-th coefficient, FFM 32 receives syndrome $S_{i-j+1}$ as one input and the j-th coefficient of $\hat{\sigma}(x)$, $\hat{\sigma}_j$, as another input. FFA 34 and register 36 are used to accumulate the multiplication results. When $\hat{\sigma}(x)$ is computed after 2t steps, its coefficients, $\hat{\sigma}_j$, will be stored in buffer 56. By setting the output of buffer 60 or register 40 to zero and the output of register 44 to one, the output of buffer 56 can be circulated and fed to the input of FFM 32. The output of the direct computation of $\hat{\Omega}(x)$, $\hat{\Omega}_i$, will be obtained at output terminal 38.

The total number of cycles required to compute $\hat{\sigma}(x)$ and $\hat{\Omega}(x)$ using the three-FFM architecture of the preferred embodiment is of interest in considering the potential impact on the overall system performance. From the iterative algorithm, it is demonstrated that the degree of $\hat{\sigma}^{(i)}(x)$ increases at most by one during each iteration. Therefore, the equation $v_i = v_i - 1 + 1$ is used to set the upper bound of $v_i + \rho$.

Separate results for (1) error correction, and (2) error and erasure correction are demonstrated below. If only errors are corrected, $2t <= N-K$, only 1 cycle is needed to compute $\hat{\Delta}^{(0)}$ and $v_i \le i$, for $0 \le i \le t$ and $v_i \le t$, for $t \le i \le 2t$. The number of cycles required to compute $\hat{\sigma}(x)$ is:

$$\sum_{i=0}^{2t-1}(v_i + 1) \le \sum_{i=0}^{t-1}(i+1) + \sum_{i=t}^{2t-1}(t+1) = \frac{3}{2}t^2 \frac{3}{2}t.$$

The number of cycles required to compute $\hat{\Omega}(x)$ is:

$$\sum_{i=0}^{t-1}(i+1)\frac{1}{2}t^2 + \frac{1}{2}t.$$

Hence the total number of cycles is less than $2t^2 + 2t + 1$.

If both errors and erasures are corrected, $2t + \rho <= N-K$, $\rho + 1$ cycles are needed to compute the initial $\hat{\Delta}^{(\rho)}$ and $v_i \le \rho + i$, for $0 \le i < t$ and $v_i \le \rho + t$, for $t \le i < 2t$. The number of cycles to compute $\hat{\sigma}(x)$ is:

$$\sum_{i=0}^{2t-1}(v_i + 1) \le \sum_{i=0}^{t-1}(\rho + i + 1) + \sum_{i=t}^{2t-1}(\rho + t + 1) = \frac{3}{2}t^2 + \left(2\rho + \frac{3}{2}\right)t$$

The number of cycles required to compute $\hat{\Omega}(x)$ is:

$$\sum_{i=0}^{t+\rho-1}(i+1) = \frac{1}{2}t^2 + \left(\rho + \frac{1}{2}\right)t + \frac{1}{2}\rho(\rho+1).$$

Hence the total number of cycles is less than $2t^2 + (3\rho + 2)t + (½)\rho(\rho+1) + \rho + 1$. Since t and $\rho$ are integers, there is not a closed-form formula for $(t, \rho)$ that maximizes the total number of cycles under the constraint of $2t + \rho <= N-K$. Instead, the maximum number of cycles for different (N,K) RS codes with N-K ranging from 4 to 16 are enumerated and listed in Table 3. If N is larger than the number of cycles required, the method and apparatus of the present invention can therefore be applied to reduce the hardware complexity while maintaining the overall decoding speed.

TABLE 3

| N − K | t | ρ | cycles |
|---|---|---|---|
| 4 | 2 | — | 13 |
| 4 | 1 | 2 | 16 |
| 6 | 3 | — | 25 |
| 6 | 1 | 4 | 31 |
| 8 | 4 | — | 41 |
| 8 | 2 | 4 | 51 |
| 10 | 5 | — | 61 |
| 10 | 2 | 6 | 76 |
| 12 | 6 | — | 85 |
| 12 | 3 | 6 | 106 |
| 14 | 7 | — | 113 |
| 14 | 3 | 8 | 141 |
| 16 | 8 | — | 145 |
| 16 | 4 | 8 | 181 |

There are many applications of BCH and RS codes in communications and storage systems that benefits from methods and apparatus of the present invention. For example, Digital Versatile Disks (DVDs) use a RS product code which is (182, 172) in the row direction and (208, 192) in the column direction; Digital TV broadcasting uses a (204, 188) RS codes; CD-ROM uses a number of smaller RS codes, including (32, 28), (28, 24); in wireless communications, the AMPS cellular phone system uses (40, 28) and (48, 36) binary BCH codes, which are both shorten codes of the (63, 51) code. The (63, 51) code, which can correct up to 2 errors (N−K=12, m=6), requires fewer than 12 cycles (t=2, row 1 of Table 3). All of these applications, as well as many others, can benefit from the methods and apparatus of the present invention.

APPENDIX-A

Decomposed Inversionless Berlekamp-Massey Algorithm

Part I: (for computing $\hat{\sigma}(x)$)

$D^{(\rho-1)} = 0, \hat{\delta} = 1;$ /* initial conditions */

$\hat{\sigma}^{(\rho-1)}(x) = \hat{\tau}^{(\rho-1)}(x) = \Lambda(x),$ $\hat{\Delta}^{(\rho)} = T_{\rho+1}\Lambda_o + T_\rho\Lambda_1 + \ldots + T_1\Lambda_\rho$ for i = $\rho$ to N − K − 1 begin /* begin outer loop */

$\hat{\sigma}_0^{(i)} = \hat{\delta}\hat{\sigma}_0^{(i-1)}$ if i ! = $\rho$ $\hat{\Delta}^{(i)} = \hat{\Delta}^{(i)}_{v_{i-1}+\rho} + T_{i-v_{i-1}+\rho+1}\hat{\sigma}^{(i-1)}_{v_{i-1}+\rho};$ $\hat{\Delta}_0^{(i+1)} = 0$ for j = 1 to $v_i + \rho$ begin /* begin inner loop */

$\hat{\sigma}_j^{(i)} = \hat{\delta}\hat{\sigma}_j^{(i-1)} + \hat{\Delta}^{(i)}\hat{\tau}^{(i-1)}_{j-1}$ $\hat{\Delta}_j^{(i+1)} = \hat{\Delta}_{j-1}^{(i+1)} + T_{i-j+3}\hat{\sigma}^{(i)}_{j-1}$ end loop /* end inner loop */

If $\hat{\Delta}^{(i)} = 0$ or $2D^{(i-1)} \geq i + 1$ $D^{(i)} = D^{(i-1)}, \hat{\tau}^{(i)}(x) = x\hat{\tau}^{(i-1)}(x);$ else $D^{(i)} = i + 1 - D^{(i-1)}, \hat{\delta} = \hat{\Delta}^{(i)}, \hat{\tau}^{(i)}(x) = \hat{\sigma}^{(i-1)}(x);$ end loop /* end outer loop */

$\hat{\sigma}(x) = \hat{\sigma}_0^{(N-K-1)} + \hat{\sigma}_1^{(N-K-1)}x + \ldots + \hat{\sigma}_{v+\rho}^{(N-K-1)}x^{v+\rho}$ $\overset{\Delta}{=} \hat{\sigma}_0 + \hat{\sigma}_1 x + \ldots + \hat{\sigma}_{v+\rho}x^{v+\rho}$ Part II: (for computing $\hat{\Omega}(x)$)

$\Omega_0^{(o)} = S_1 \hat{\sigma}_0$ for i = 1 to $v + \rho - 1$ begin $\hat{\Omega}_i^{(0)} = S_{i+1}\hat{\sigma}_0$ for j = 1 to i begin $\hat{\Omega}_i^{(j)} = \hat{\Omega}_i^{(j-1)} + S_{i-j+1}\hat{\sigma}_j$ end loop end loop $\hat{\Omega}(x) = \hat{\Omega}_0^{(0)} + \hat{\Omega}_1^{(1)}x + \ldots + \hat{\Omega}_{v+\rho-1}^{(v+\rho-1)}x^{v+\rho-1}$ $\overset{\Delta}{=} \hat{\Omega}_0 + \hat{\Omega}_1 + \ldots + \hat{\Omega}_{v+\rho-1}x^{v+\rho-1}$ Although the present invention has been described in terms of specific embodiments it is anticipated that alterations and modifications thereof will no doubt become apparent to those skilled in the art. It is therefore intended that the following claims be interpreted as covering all such alterations and modifications as fall within the true spirit and scope of the invention.

What we claim is:

1. An apparatus for calculating key equation polynomials in the decoding of a received codeword encoded for error correction, said key equation polynomials including an error locator polynomial and an error evaluator polynomial, comprising:

(a) a first subcircuit for receiving a syndrome representing the error pattern of a received codeword encoded for error correction, a generated partial discrepancy value, and an error locator polynomial coefficient to generate a partial discrepancy value, said first subcircuit including a first multiplier, a first adder, and a first storage element, said multiplier receiving as input said error locator polynomial coefficient and said syndrome to generate an input to said first adder, said first adder generating an output to a first output terminal and to said first storage element which is connected back to said first adder for summation operation; and (b) a second subcircuit for receiving the previously generated partial discrepancy value, a generated discrepancy, a generated error locator polynomial coefficient, and a generated auxiliary polynomial coefficient to generate an error locator polynomial coefficient.

2. An apparatus as recited in claim 1 wherein said multipliers and said adders are finite field multipliers and finite field adders.

3. An apparatus for calculating key equation polynomials in the decoding of a received codeword encoded for error correction, said key equation polynomials including an error locator polynomial and an error evaluator polynomial, comprising:

(a) a first subcircuit for receiving a syndrome representing the error pattern of a received codeword encoded for error correction, a generated partial discrepancy value, and an error locator polynomial coefficient to generate a partial discrepancy value; and (b) a second subcircuit for receiving the previously generated partial discrepancy value, a generated discrepancy, a generated error locator polynomial coefficient, and a generated auxiliary polynomial coefficient to generate an error locator polynomial coefficient;

said second subcircuit including a first storage element for receiving and selectively storing a first signal and providing said stored first signal to a first multiplier and a first multiplexer, said first multiplier receiving a first buffered signal as a second input to generate an output to a first adder, said first multiplexer receiving a feedback signal as a second input to generate a signal for input to a second storage element, said second storage element providing the stored signal to a second multiplier as input, said second multiplier receiving as a second input a second buffered signal to generate an output signal to said first adder, said first adder generating an output signal to a third storage element and a second output terminal, said third storage element providing the stored signal to said first subcircuit and a first buffer, said first buffer generating said second buffered signal for input to said second multiplier and a second multiplexer, said second multiplexer generating a selected signal to a second buffer for providing said first buffered signal to said first multiplier and said second multiplexer.

4. An apparatus as recited in claim 3 wherein the multipliers and the adders are finite field multipliers and finite field adders.

5. An apparatus for calculating key equation polynomials in the decoding of a received codeword encoded for error correction, said key equation polynomials including an error locator polynomial and an error evaluator polynomial, comprising:

(a) a first subcircuit for receiving a syndrome representing the error pattern of a received codeword encoded for error correction, a generated partial discrepancy value, and an error locator polynomial coefficient to generate a partial discrepancy value, said first subcircuit generating said partial discrepancy value during a first time period and generating a partial error evaluator polynomial coefficient during a second time period; and (b) a second subcircuit for receiving the previously generated partial discrepancy value, a generated discrepancy, a generated error locator polynomial coefficient, and a generated auxiliary polynomial coefficient to generate an error locator polynomial coefficient;

wherein during said second period said first subcircuit receives a syndrome, a generated partial value of an error evaluator polynomial coefficient, and a generated error locator polynomial coefficient to generate a partial result of an error evaluator polynomial coefficient, and said second subcircuit is operated to allow said error locator polynomial coefficient to pass through to said first circuit for processing by said first subcircuit.

6. An apparatus for calculating key equation polynomials in the decoding of a received codeword encoded for error and erasure correction, said key equation polynomials including an errata locator polynomial and an errata evaluator polynomial, comprising:

(a) a first subcircuit for receiving a Forney syndrome, a generated partial discrepancy value, and an errata locator polynomial coefficient to generate a partial discrepancy value, said first subcircuit generating said partial discrepancy value during a first time period and generating a partial errata evaluator polynomial coefficient during a second time period; and (b) a second subcircuit for receiving a previously generated discrepancy, a generated discrepancy, a generated errata locator polynomial coefficient, and a generated auxiliary polynomial coefficient to generate an errata locator polynomial coefficient, wherein during said second period, said first subcircuit receives a first syndrome, a generated partial value of an errata evaluator polynomial coefficient, and a generated errata locator polynomial to generate a partial result of an errata evaluator polynomial coefficient, and said second subcircuit is operated to allow said errata locator polynomial coefficient to pass through to said first circuit for processing by said first subcircuit.

7. An apparatus for calculating key equation polynomials in the decoding of a received codeword encoded for error correction, said key equation polynomials including an error locator polynomial and an error evaluator polynomial, comprising:

(a) a first subcircuit for receiving a syndrome representing the error pattern of a received codeword encoded for error correction, a generated partial discrepancy value, and an error locator polynomial coefficient to generate a partial discrepancy value, wherein said first subcircuit includes a first finite-field multiplier, a first finite-field adder and a first storage element, said first finite-field multiplier receiving as input said error locator polynomial coefficient and said syndrome and operative to generate an input to said first finite-field adder, said first finite-field adder generating an output at a first output terminal and for input to said first storage element, the output of which is connected back to said first finite-field adder for summation operation; and (b) a second subcircuit for receiving a previously generated discrepancy, a generated discrepancy, a generated error locator polynomial coefficient, and a generated auxiliary polynomial coefficient and operative to generate an error locator polynomial coefficient, wherein said second subcircuit includes second and third finite-field multipliers, a second finite-field adder, second, third and forth storage elements, first and second multiplexes, and first and second buffers, said second storage element being operative to receive and selectively store a first signal and to provide said stored first signal to said second finite-field multiplier, and said first multiplexer, said second finite-field multiplier receiving a first buffered signal as a second input and being operative to generate an output to said second finite-field adder, said first multiplexer receiving a feedback signal as a second input and operative to generate a signal for input to a third storage element, said third storage element providing the stored signal to said third finite-field multiplier as input, said third finite-field multiplier receiving as a second input a second buffered signal and being operative to generate an output signal for input to said second finite-field adder, said second finite-field adder generating an output signal for input to a fourth storage element operative to provide the stored signal to said first subcircuit and to said first buffer, said first buffer generating said second buffered signal for input through a first input of said second mulitplexer to said second buffer for providing said first buffered signal to said second finite-field multiplier and to a second input of said second multiplexer.

8. An apparatus as recited in claim 7 wherein said first subcircuit generates said partial discrepancy value during a first time period and generates a partial error evaluator polynomial coefficient during a second time period, during said second period said first subcircuit receiving a syndrome, a generated partial value of an error evaluator polynomial coefficient, and a generated error locator polynomial coefficient to generate a partial result of an error evaluator polynomial coefficient, said second subcircuit being operative to allow said error locator polynomial coefficient to pass through to said first subcircuit for processing.

9. An apparatus for calculating key equation polynomials in the decoding of a received codeword encoded for error and erasure correction, said key equation polynomials including an errata locator polynomial and an errata evaluator polynomial, comprising:

(a) a first subcircuit for receiving a Forney syndrome, a generated partial discrepancy value, and an errata locator polynomial coefficient to generate an operative partial discrepancy value, wherein said first subcircuit includes a first finite-field multiplier, a first finite-field adder and a first storage element, said first finite-field multiplier receiving as input said errata locator polynomial coefficient and said syndrome to generate an input to said first finite-field adder, said first finite-field adder generating an output at a first output terminal and for input to said first storage element which is connected back to said first finite-field adder for summation operation; and (b) a second subcircuit for receiving a previously generated discrepancy, a generated discrepancy, a generated errata locator polynomial coefficient, and a generated auxiliary polynomial coefficient to generate an errata locator polynomial coefficient, wherein said second subcircuit includes first and second finite-field multipliers, a finite-field adder, second, third and forth storage elements, first and second multiplexers, and first and second buffers, said second storage element being operative to receive and selectively store a first signal and to provide said stored first signal to said second finite-field multiplier and said first multiplexer, said second finite-field multiplier receiving a first buffered signal as a second input and being operative to generate an output to said second finite-field adder, said first multiplexer receiving a feedback signal as a second input to generate a signal to a third storage element, said third storage element providing the stored signal to a third finite-field multiplier as input, said third finite-filed multiplier receiving as a second input a second buffered signal to generate an output signal to said second finite-field adder, said second finite-field adder generating an output signal to a fourth storage element providing the stored signal to said first subcircuit to a first buffer, said first buffer generating said second buffered signal to a second buffer for providing said first buffered signal to said second finite-field multiplier and said second multiplexer.

10. An apparatus as recited in claim 9 wherein said first subcircuit generates said partial discrepancy value during a first time period and generates a partial errata evaluator polynomial coefficient during a second time period, during said second period said first subcircuit receiving a syndrome, a generated partial value of an errata evaluator polynomial coefficient, and a generated errata locator polynomial coefficient to generate a partial result of an errata evaluator polynomial coefficient, said second subcircuit being operative to allow said errata locator polynomial coefficient to pass through to said first subcircuit for processing by said first subcircuit.

* * * * *